United States Patent
Fan et al.

(10) Patent No.: US 10,461,702 B2
(45) Date of Patent: Oct. 29, 2019

(54) AMPLIFIER CIRCUIT HAVING POLY RESISTOR WITH BIASED DEPLETION REGION

(71) Applicant: MEDIATEK INC., Hsin-Chu (TW)

(72) Inventors: Tsun-Yuan Fan, Changhua County (TW); Tze-Chien Wang, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/911,187

(22) Filed: Mar. 5, 2018

(65) Prior Publication Data

US 2018/0309415 A1    Oct. 25, 2018

Related U.S. Application Data

(60) Provisional application No. 62/487,012, filed on Apr. 19, 2017.

(51) Int. Cl.
| | |
|---|---|
| *H03F 1/34* | (2006.01) |
| *H03F 3/45* | (2006.01) |
| *H03F 1/32* | (2006.01) |
| *H01L 49/02* | (2006.01) |

(52) U.S. Cl.
CPC ............ *H03F 1/34* (2013.01); *H01L 28/20* (2013.01); *H03F 1/3211* (2013.01); *H03F 3/45475* (2013.01); *H03F 3/45479* (2013.01); *H03F 2203/45151* (2013.01); *H03F 2203/45524* (2013.01); *H03F 2203/45528* (2013.01); *H03F 2203/45601* (2013.01); *H03F 2203/45698* (2013.01); *H03F 2203/45701* (2013.01)

(58) Field of Classification Search
USPC ............................. 330/252–261, 307
See application file for complete search history.

(56) References Cited

U.S. PATENT DOCUMENTS

| | | | |
|---|---|---|---|
| 4,164,668 | A | 8/1979 | Delaporte et al. |
| 4,263,518 | A | 4/1981 | Ballatore et al. |
| 5,027,081 | A | 6/1991 | Baum |
| 6,087,677 | A | 7/2000 | Wu |
| 6,369,654 | B1 | 4/2002 | Inagaki |
| | | (Continued) | |

FOREIGN PATENT DOCUMENTS

| | | |
|---|---|---|
| EP | 3309850 A2 | 4/2018 |
| GB | 1431 199 A | 4/1976 |
| | (Continued) | |

OTHER PUBLICATIONS

Gennady Gildenblat, Compact Modeling—Principles, Techniques and Applications, cover page & pp. 282-284, 2010.

*Primary Examiner* — Hieu P Nguyen
(74) *Attorney, Agent, or Firm* — Winston Hsu

(57) ABSTRACT

The present invention provides an amplifier circuit, wherein the amplifier circuit includes an operational amplifier and a feedback path. The operational amplifier has an input terminal and an output terminal, and is arranged for receiving an input signal to generate an output signal. The feedback path is coupled between the input terminal and the output terminal of the operational amplifier, wherein the feedback path comprises at least two poly resistors, and a depletion region of at least one of the two poly resistors is biased by the output signal generated by the operational amplifier.

12 Claims, 2 Drawing Sheets

(56) References Cited

U.S. PATENT DOCUMENTS

| | | |
|---|---|---|
| 7,105,912 B2 | 9/2006 | Chen |
| 7,199,016 B2 | 4/2007 | Heston |
| 8,482,099 B2 | 7/2013 | Enjalbert |
| 8,878,334 B1 | 11/2014 | Ratnakumar |
| 9,467,100 B2 | 10/2016 | Dhanasekaran |
| 9,685,435 B2 | 6/2017 | Lui |
| 2004/0070050 A1 | 4/2004 | Chi |
| 2005/0264360 A1* | 12/2005 | Ma .................... H03G 1/0088 330/282 |
| 2009/0002120 A1 | 1/2009 | Molin |
| 2009/0085657 A1 | 4/2009 | Yang |
| 2010/0007535 A1 | 1/2010 | Schwarzer |
| 2010/0109775 A1 | 5/2010 | Kamakura |
| 2011/0248787 A1 | 10/2011 | Jiang |
| 2016/0276990 A1 | 9/2016 | Aoyama |
| 2017/0187336 A1 | 6/2017 | Mehrabi |
| 2018/0233499 A1 | 8/2018 | Wen |

FOREIGN PATENT DOCUMENTS

| | | |
|---|---|---|
| GB | 1431199 | 4/1976 |
| GB | 1431199 A | 4/1976 |
| TW | 308718 | 6/1997 |
| TW | 200810140 | 2/2008 |
| TW | 201433956 A | 9/2014 |
| TW | I487009 B | 6/2015 |
| TW | 201635559 A | 10/2016 |
| WO | 2009/125256 A1 | 10/2009 |

\* cited by examiner

AMPLIFIER CIRCUIT HAVING POLY RESISTOR WITH BIASED DEPLETION REGION

CROSS REFERENCE TO RELATED APPLICATIONS

This application claims the priority of U.S. Provisional Application No. 62/487,012, filed on Apr. 19, 2017, which is included herein by reference in its entirety.

BACKGROUND

A poly resistor always suffers a depletion effect that a resistance of the poly resistor is varied with a voltage difference between the poly resistor and a substrate. Therefore, when the poly resistor is used in a feedback path of a linear amplifier, this depletion effect may degrade the linearity of the linear amplifier.

SUMMARY

It is therefore an objective of the present invention to provide an amplifier circuit, where a signal-relative voltage is applied to a depletion region of a poly resistor within the linear amplifier to improve the depletion effect.

According to one embodiment of the present invention, an amplifier circuit is provided, wherein the amplifier circuit includes an operational amplifier and a feedback path. The operational amplifier has an input terminal and an output terminal, and is arranged for receiving an input signal to generate an output signal. The feedback path is coupled between the input terminal and the output terminal of the operational amplifier, wherein the feedback path comprises at least at least two poly resistors, and a depletion region of at least one of the two poly resistor is biased by the output signal generated by the operational amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
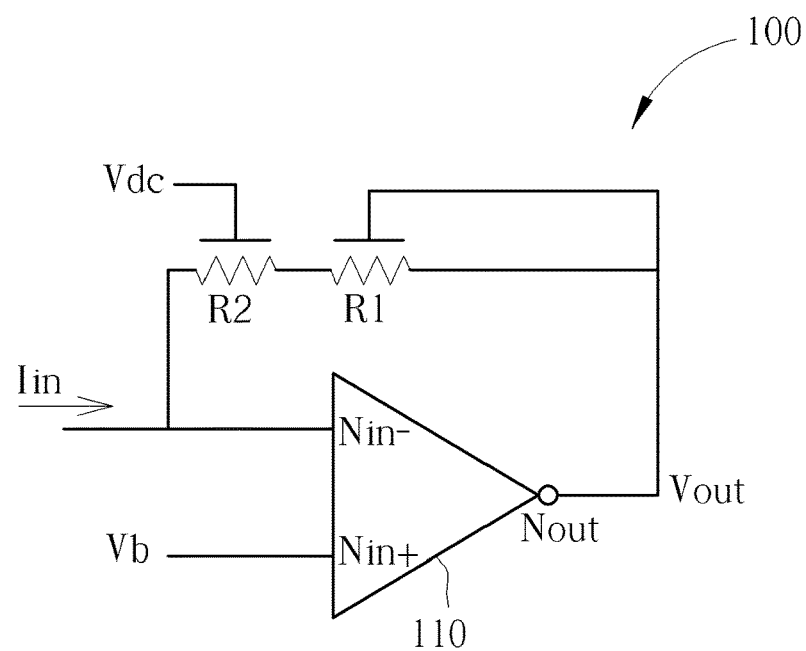
FIG. 1 is a diagram illustrating an amplifier circuit according to a first embodiment of the present invention.

FIG. 1 is a diagram illustrating an amplifier circuit 100 according to a first embodiment of the present invention. As shown in FIG. 1, the amplifier circuit 100 comprises an operational amplifier 110, and a feedback path comprising two poly resistors R1 and R2 connected in series. In the embodiment shown in FIG. 1, the operational amplifier 110 comprises two input terminals Nin+ and Nin− and an output terminal Nout, where the input terminal Nin+ is coupled to a bias voltage Vb such as a ground voltage or any suitable reference voltage, and an input signal Iin (current signal) is inputted to the input terminal Nin− to generate an output signal Vout at the output terminal Nout.

Figure 2:
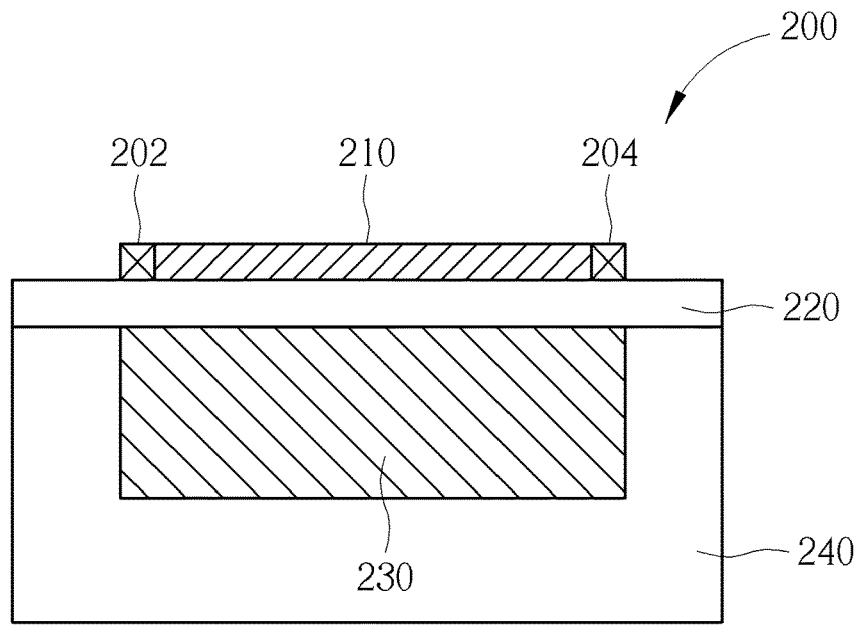
FIG. 2 shows a poly resistor according to one embodiment of the present invention.

FIG. 2 shows a poly resistor 200 according to one embodiment of the present invention, where poly resistor 200 can be used to implement each one of the poly resistors R1 and R2. As shown in FIG. 2, the poly resistor 200 comprises a resistive layer 210 having two terminals 202 and 204, an dielectric layer 220, a conductive layer 230 and a substrate 240, wherein the resistive layer 210 is made by poly-silicon, the conductive layer 230 can be made by any suitable metal layer or N-doped or P-doped silicon, and the resistive layer 210 and the conductive layer 230 are isolated by the dielectric layer 220. When the poly resistor 200 is used in the amplifier circuit 100, because a voltage level at the resistive layer 210 may be varied due to the output signal Vout, depletion or charge accumulation at a lower portion of the resistive layer 210 and an upper portion of the conductive layer 230 may be varied due to a varied voltage difference between the resistive layer 210 the conductive layer 230, causing an unstable or nonlinear resistance of the poly resistor 200. The aforementioned situation is called the depletion effect. In the amplifier circuit 100 shown in FIG. 1, in order to cancel the depletion effect, the output signal Vout generated by the operational amplifier 110 is directly inputted into a depletion region of the poly resistor R1, and a depletion region of the poly resistor R2 is biased by a reference voltage Vdc such as a ground voltage or any suitable fixed voltage. In this embodiment, the depletion region may indicate the conductive layer 230, that is the conductive layer 230 of the poly resistor R1 is directly biased (dynamically biased) by the output signal Vout, and the conductive layer 230 of the poly resistor R2 is biased by the reference voltage Vdc.

In the embodiment shown in FIG. 1, by using the poly resistors R1 and R2 whose depletion regions are biased by the output signal Vout and the reference voltage, respectively, the poly resistor R1 will have a positive nonlinear effect, and the poly resistor R2 will have a negative nonlinear effect. By using the poly resistors R1 and R2 in the feedback path in the amplifier circuit 100, the positive nonlinear effect of the poly resistors R1 and the negative nonlinear effect of the poly resistors R2 are cancelled out, that is the resistance of the feedback path (i.e. the combined resistance of the poly resistors R1 and R2) is more stable, and the linearity of the amplifier circuit 100 is improved.

In another embodiment of the present invention, the depletion region of the poly resistor R2 shown in FIG. 1 may be floating (i.e. not connect to any reference voltage), and this design may also improve the resistance stability of the feedback path.

Figure 3:
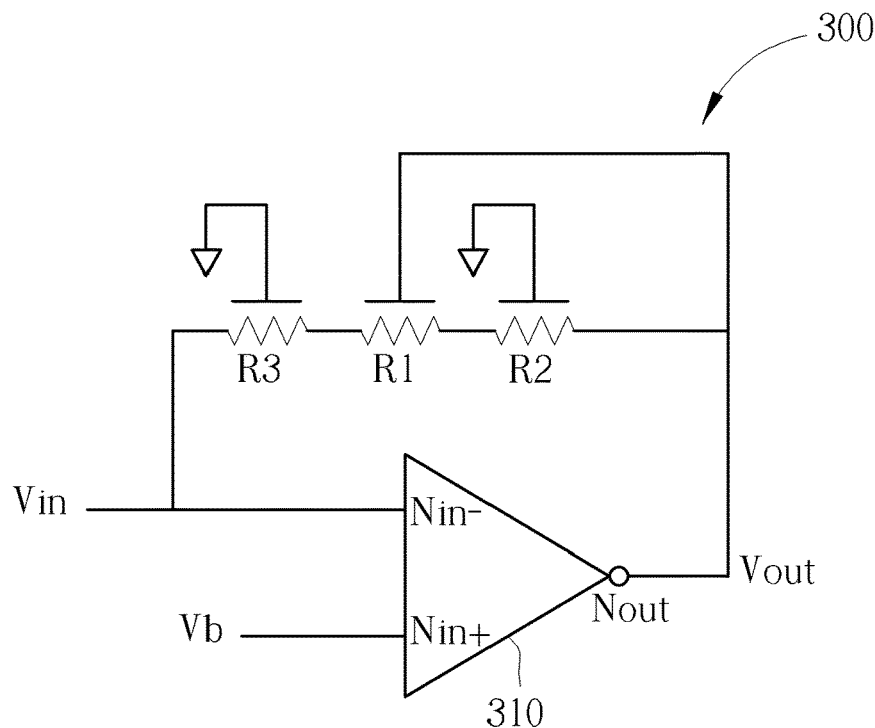
FIG. 3 is a diagram illustrating an amplifier circuit according to a second embodiment of the present invention.

FIG. 3 is a diagram illustrating an amplifier circuit 300 according to a second embodiment of the present invention. As shown in FIG. 3, the amplifier circuit 300 comprises an operational amplifier 310, and a feedback path comprising three poly resistors R1, R2 and R3 connected in series. In the embodiment shown in FIG. 3, the operational amplifier 310 comprises two input terminals Nin+ and Nin− and an output terminal Nout, where the input terminal Nin+ is coupled to a bias voltage Vb such as a ground voltage or any suitable reference voltage, and an input signal Vin is inputted to the input terminal Nin− to generate an output signal Vout at the output terminal Nout.

In this embodiment, each of the poly resistors R1, R2 and R3 can be implemented by the poly resistor 200 shown in FIG. 2, the output signal Vout generated by the operational amplifier 110 is directly inputted into a depletion region of the poly resistor R1, and depletion regions of the poly resistors R2 and R3 are biased by a reference voltage such as a ground voltage or any suitable fixed voltage. In this embodiment, the depletion region may indicate the conductive layer 230, that is the conductive layer 230 of the poly resistor R1 is directly biased (dynamically biased) by the output signal Vout, and the conductive layers 230 of the poly resistors R2 and R3 are biased by the reference voltage. Therefore, by using the poly resistors R1-R3 whose depletion regions are biased by the output signal Vout and the reference voltage, respectively, the nonlinear effects of the poly resistors R1-R3 are cancelled out, that is the resistance of the feedback path (i.e. the combined resistance of the poly resistors R1-R3) is more stable, and the linearity of the amplifier circuit 300 is improved.

In another embodiment of the present invention, the depletion regions of the poly resistors R2 and R3 shown in FIG. 3 may be connected to a reference voltage or floating. For example, the depletion regions of the poly resistors R2 and R3 may be floating; or the depletion region of one of the poly resistors R2 and R3 is floating while the other one is connected to the reference voltage. These alternative shall fall within the scope of the present invention.

Figure 4:
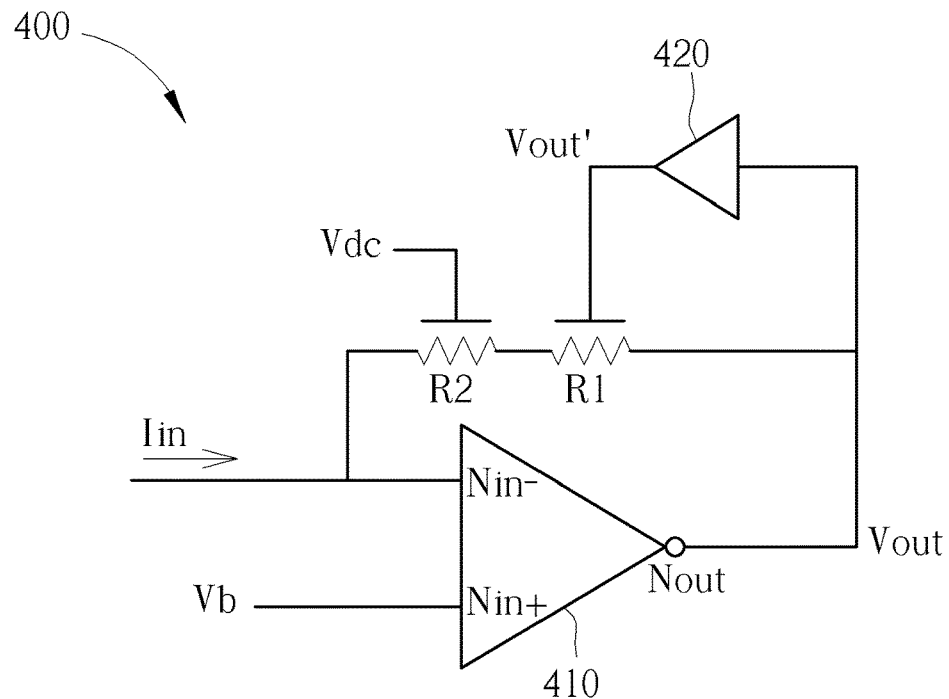
FIG. 4 is a diagram illustrating an amplifier circuit according to a third embodiment of the present invention.

FIG. 4 is a diagram illustrating an amplifier circuit 400 according to a third embodiment of the present invention. As shown in FIG. 4, the amplifier circuit 400 comprises an operational amplifier 410, a buffer 420, and a feedback path comprising two poly resistors R1 and R2 connected in series. In the embodiment shown in FIG. 4, the operational amplifier 410 comprises two input terminals Nin+ and Nin− and an output terminal Nout, where the input terminal Nin+ is coupled to a bias voltage Vb such as a ground voltage or any suitable reference voltage, and an input signal Vin is inputted to the input terminal Nin− to generate an output signal Vout at the output terminal Nout. The buffer 420 can be implemented by a source follower or a unit gain buffer.

In this embodiment, each of the poly resistors R1 and R2 can be implemented by the poly resistor 200 shown in FIG. 2. In the amplifier circuit 400 shown in FIG. 4, the buffer 420 receives the output signal Vout to generate a buffered output signal Vout', and the buffered output signal Vout' is directly inputted into a depletion region of the poly resistor R1, and a depletion region of the poly resistor R2 is biased by a reference voltage Vdc such as a ground voltage or any suitable fixed voltage. In this embodiment, the depletion region may indicate the conductive layer 230, that is the conductive layer 230 of the poly resistor R1 is directly biased (dynamically biased) by the buffered output signal Vout', and the conductive layer 230 of the poly resistor R2 is biased by the reference voltage Vdc.

In another embodiment of the present invention, the depletion region of the poly resistor R2 shown in FIG. 4 may be floating (i.e. not connect to any reference voltage), and this design may also improve the resistance stability of the feedback path.

Briefly summarized, in the amplifier circuit of the present invention, by controlling bias voltages of the depletion region of the poly resistors in the feedback path, the nonlinear effects of the poly resistors R1 and R2 can be cancelled out to improve the linearity of the amplifier circuit. In addition, the embodiments of the present invention do not need too many additional elements, that is the manufacturing cost will not increase too much.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
    an operational amplifier having an input terminal and an output terminal, for receiving an input signal to generate an output signal;
    a feedback path coupled between the input terminal and the output terminal of the operational amplifier, wherein the feedback path comprises at least two poly resistors, and a depletion region of at least one of the two poly resistors is biased by the output signal generated by the operational amplifier;
    wherein the operational amplifier generates the output signal to a conductive layer, without passing through any other poly resistor, to directly bias the depletion region of the at least one of the two poly resistors, wherein the conductive layer is isolated from the poly resistors.

2. The amplifier circuit of claim 1, wherein the operational amplifier generates the output signal to the depletion region of the at least one of the two poly resistors via a buffer.

3. The amplifier circuit of claim 2, wherein the two poly resistors are connected in series.

4. The amplifier circuit of claim 3, wherein the at least one of the poly resistors is coupled to the output terminal of the operational amplifier, and the other one of the two poly resistors is coupled to the input terminal of the operational amplifier.

5. An amplifier circuit, comprising:
    an operational amplifier having an input terminal and an output terminal, for receiving an input signal to generate an output signal;
    a feedback path coupled between the input terminal and the output terminal of the operational amplifier, wherein the feedback path comprises at least two poly resistors, and a depletion region of at least one of the two poly resistors is biased by the output signal generated by the operational amplifier;
    wherein a depletion region of the other one of the two poly resistors is biased by a fixed voltage.

6. The amplifier circuit of claim 5, wherein the two poly resistors are connected in series.

7. The amplifier circuit of claim 6, wherein the at least one of the poly resistors is coupled to the output terminal of the operational amplifier, and the other one of the two poly resistors is coupled to the input terminal of the operational amplifier.

8. An amplifier circuit, comprising:
    an operational amplifier having an input terminal and an output terminal, for receiving an input signal to generate an output signal;
    a feedback path coupled between the input terminal and the output terminal of the operational amplifier, wherein the feedback path comprises at least two poly resistors, and a depletion region of at least one of the two poly resistors is biased by the output signal generated by the operational amplifier;

wherein a depletion region of the other one of the two poly resistors is floating.

9. The amplifier circuit of claim 8, wherein the two poly resistors are connected in series.

10. The amplifier circuit of claim 9, wherein the at least one of the poly resistors is coupled to the output terminal of the operational amplifier, and the other one of the two poly resistors is coupled to the input terminal of the operational amplifier.

11. An amplifier circuit, comprising:
an operational amplifier having an input terminal and an output terminal, for receiving an input signal to generate an output signal;
a feedback path coupled between the input terminal and the output terminal of the operational amplifier, wherein the feedback path comprises at least two poly resistors, and a depletion region of at least one of the two poly resistors is biased by the output signal generated by the operational amplifier;

wherein the feedback path comprises a first poly resistor, a second poly resistor and a third poly resistor connected in series, a depletion of the first poly resistor is biased by the output signal, and depletion regions of the second poly resistor and the third poly resistor are biased by a reference voltage or floating.

12. The amplifier circuit of claim 11, wherein the second poly resistor is coupled to the output terminal of the operational amplifier, the third poly resistor is coupled to the input terminal of the operational amplifier, and the first poly resistor is coupled between the second poly resistor and the third poly resistor.

* * * * *